United States Patent [19]

Woo

[11] Patent Number: 4,779,057
[45] Date of Patent: Oct. 18, 1988

[54] CASCODE AMPLIFIER WITH NONLINEARITY CORRECTION AND IMPROVE TRANSIENT RESPONSE

[75] Inventor: James Woo, Portland, Oreg.

[73] Assignee: Tektronix, Inc., Beaverton, Oreg.

[21] Appl. No.: 82,395

[22] Filed: Aug. 6, 1987

[51] Int. Cl.$^4$ .............................................. H03F 1/32
[52] U.S. Cl. .................................... 330/149; 330/151; 330/252; 330/311
[58] Field of Search ................. 330/149, 151, 69, 252, 330/261, 311

[56] References Cited

U.S. PATENT DOCUMENTS 4,267,516  5/1981  Traa ..................................... 330/149
4,390,848  6/1983  Blauschild ........................... 330/151

Primary Examiner—James B. Mullins
Attorney, Agent, or Firm—Peter J. Meza

[57] ABSTRACT

An improved cascomp amplifier includes a main differential transconductance amplifier stage, a pair of diode connected sense transistors and a differential correction amplifier stage. The sense transistors present a precise measure of the error voltage to the correction amplifier and extend the reverse breakdown voltage of the input stage of the main amplifier. The sense transistors are also used to correct additional gain variations due to transistor beta. The correction amplifier provides a current which cancels the nonlinearities of the main amplifier. The configuration of the correction amplifier reduces the capacitive load to the main amplifier thereby reducing aberrations in the transient response.

15 Claims, 2 Drawing Sheets

4,779,057

CASCODE AMPLIFIER WITH NONLINEARITY CORRECTION AND IMPROVE TRANSIENT RESPONSE

BACKGROUND OF THE INVENTION

This invention is in the field of transistorized amplifiers, and relates more specifically to linear differential transconductance amplifiers.

The basic concept of using a differential correction amplifier to provide a correction signal to a main differential amplifier is shown in U.S. Pat. No. 4,146,844. Such an amplifier circuit as disclosed in that patent is shown in FIG. 1. This basic cascomp amplifier circuit has a correction amplifier consisting of transistors 14 and 16, resistor 18 and current sources 32 and 34, which takes its input from the collectors of the two input transistors 22 and 26 of the main amplifier. This circuit provides a first order nonlinearity correction of the main amplifier. However, the corrected gain will be dependent on transistor beta since the voltage presented to the correction amplifier is not the exact error voltage of the main amplifier. Further, an additional cascode output stage is required to reduce the Miller capacitance of the correction amplifier. Without this additional stage, undesirable ringing in the output current signal would occur. Lastly, the reverse breakdown voltage of the input stage, as in all simple differential pairs, is limited to the reverse breakdown voltage of one emitter base junction.

These limitations become apparent upon a closer analysis of the prior art cascomp amplifier shown in FIG. 1. In this circuit, transistors 22 and 26 form the differential input pair, the emitters of which are coupled through emitter resistor 24. The differential voltage (+VIN, −VIN) is applied to the bases of transistors 22 and 26, and the source resistance of the differential voltage input is shown by resistors 20 and 28. Current sources 30 and 36 provide the bias current to the input transistor pair. Transistors 10 and 12 form a common base amplifier stage which, in conjunction with transistors 22 and 26, form a cascode output stage. The voltage difference across the emitters of transistors 10 and 12 provides an approximation of the error voltage found in the base emitter voltage of the input pair of transistors 22 and 26. The error voltage is presented to a correction amplifier. The correction amplifier includes a differential pair of transistors 14 and 16, with their emitters coupled through emitter resistor 18. Current sources 32 and 34 provide the bias current to the transistors 14 and 16. The collector current of these two transistors is proportional to the error voltage found in the differential input pair. Accordingly, the error current generated by transistors 14 and 16 is added to the differential collector current of transistors 10 and 12, and a linear current is produced.

Although the prior art cascomp amplifier provides a linear output current, the gain of the amplifier is a function of transistor beta. The emitter currents of transistors 10 and 12 are the emitter currents of transistors 22 and 26, reduced by their respective transistor alphas. Therefore, the error voltage across the emitters of transistors 10 and 12 is not an exact copy of the error voltage found in the input transistors 22 and 26, but is slightly reduced, and by an amount which is dependant upon transistor beta. The gain of the cascomp amplifier is made even more sensitive to transistor beta by the alpha loss of the cascode output stage which includes transistors 10 and 12.

The prior art cascomp amplifier has two additional limitations. If a resistive load is connected to the collectors of transistors 10 and 12, the large reflected capacitance of the correction amplifier will be presented to the collectors of the input pair, transistors 22 and 26. This, in combination with the inductive load presented by the emitters of transistors 10 and 12, creates a resonant tank circuit at the collectors of transistors 22 and 26. In turn, this resonant circuit produces unwanted ringing in the transient response of the amplifier. This ringing may be reduced by connecting an additional common base stage to the collectors of transistors 10 and 12, but this will be at the expense of an increased sensitivity to transistor beta. Finally, the reverse breakdown voltage of the input pair is limited to the reverse breakdown voltage of one of the input transistors.

What is desired is a cascode amplifier which provides an improvement in the beta dependency of the gain, eliminates excessive ringing of the transient response without an additional cascode output stage and also provides an improvement in the reverse breakdown voltage of the input stage while maintaining linear operation over a wide dynamic range.

SUMMARY OF THE INVENTION

In accordance with the invention, a new linear transconductance amplifier includes a main differential transconductance amplifier stage which provides signal gain plus an error term, a pair of diode connected sense transistors to sense the error voltage of the main differential stage and a differential correction amplifier stage which provides an error correction current. The sense transistors present a precise measure of the error voltage found in the difference of the emitter base junction voltages of the main differential stage to the correction amplifier. The correction amplifier transforms the error voltage into a correction current which is added to the output current of the main amplifier. The configuration of the correction amplifier and sense transistors improves the transient response and the reverse breakdown voltage of the input stage.

In a preferred embodiment, the input stage is a conventional differential pair of transistors with equal valued emitter resistors. A pair of diode connected sense transistors is coupled between the two emitter resistors to sense the error voltage of the main differential stage. A bias current source is coupled to the common connection of the two sense transistors which provides the bias current to the sense transistors and the main amplifier. Each sense transistor is diode connected through an adjustment resistor. The correction amplifier is used to generate an error correction current and is a conventional differential pair of transistors with one resistor coupled between the two input transistor emitters. Two equal valued bias current sources are respectively coupled to each transistor emitter. The collectors of the correction amplifier are coupled to the collectors of the main amplifier.

A measure of the error voltage of the main amplifier is found in the voltage across the two sense transistors. This voltage is presented to the correction amplifier and an appropriate correction current is generated. However, the correction current may be further modified to eliminate the gain variations caused by transistor beta by appropriate choice of the adjustment resistors. The location of the sense transistors at the emitter resistors of the input stage provides an improved reverse breakdown voltage. Transient response is improved because the collectors of the correction amplifier are coupled to a low impedance node, thus minimizing the Miller capacitance.

DESCRIPTION OF THE PREFERRED EMBODIMENT

Figure 2:
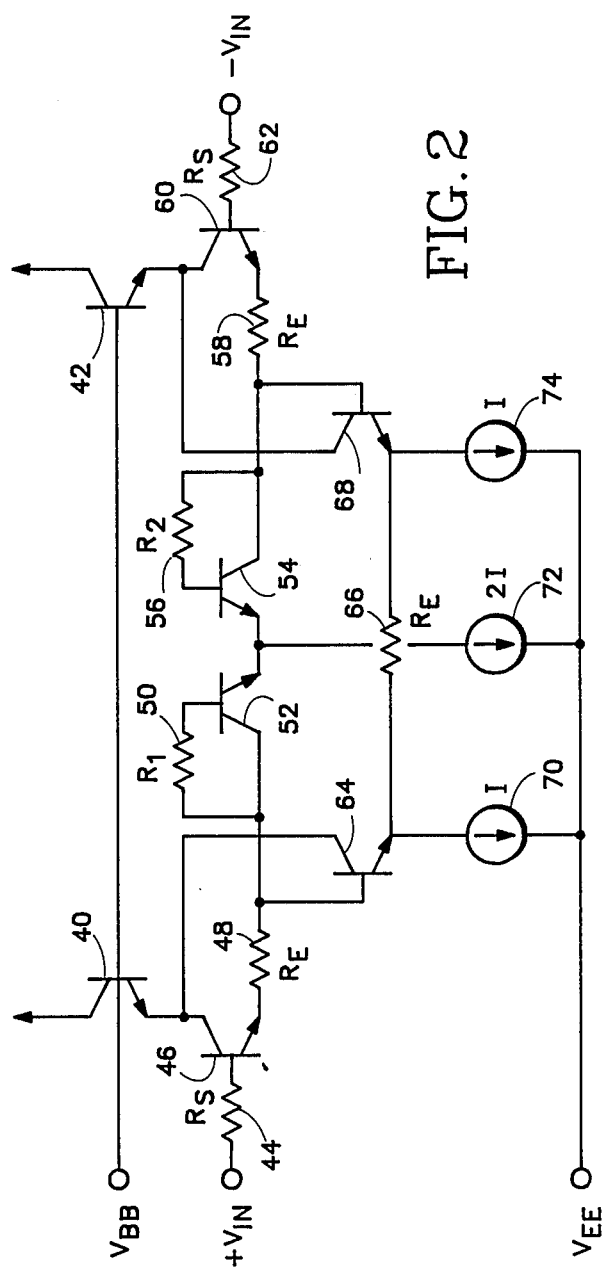
FIG. 2 is a schematic diagram of a preferred embodiment of a linear transconductance amplifier in accordance with the invention.

As shown in FIG. 2, transistors 46 and 60 form a differential input pair, the emitters of which are coupled through emitter resistors 48 and 58 and diode connected sense transistors 52 and 54. The differential voltage (+VIN, −VIN) is applied to the bases of transistors 46 and 60, the signal input source resistance being represented by resistors 44 and 62. A current source 72 provides bias current to the input transistor pair. Transistors 40 and 42 form a cascode output stage in conjunction with the input pair of transistors 46 and 60. The voltage across the collectors of diode connected transistors 52 and 54 provides an accurate replica of the error voltage found in the base emitter voltage of the input pair of transistors 46 and 60. The error voltage is presented to a correction amplifier. The correction amplifier includes a differential pair of transistors 64 and 68, the emitters of which are coupled through emitter resistor 66. Current sources 70 and 74 provide bias current to the transistors 64 and 68. The correction amplifier inputs are connected to the collectors of the emitter coupled sensor transistors 52 and 54. The collector currents of these two transistors 64 and 68 form a differential error current which is proportional to the error voltage found in the differential input pair 46 and 60, but opposite in polarity. This error current is added to the differential collector current of transistors 46 and 60, and a linear current is produced.

The linearity correction of the present invention may be demonstrated by the following equations. An error voltage (dV) exists between the Vbe of input transistors 46 and 60 and this same error voltage exists between the Vce of sense transistors 52 and 54. Therefore:

$$Vbe(46) - Vbe(60) = dV$$

and $$Vce(52) - Vce(54) = dV$$

The differential output current (dI) of the main differential amplifier, discounting source resistance and assuming infinite transistor beta and transconductance, may be expressed by the following:

$$dI_{signal} = (2*Vin - 2*dV)/(2*Re) = (Vin - dV)/Re$$

The voltage presented to the correction amplifier is simply dV. Since this voltage is small, the corresponding error voltage of this stage is also small. To a first order approximation this corresponding error voltage may be ignored. Consequently, the differential output current of the correction amplifier is given by the following:

$$dI_{error} = dV/Re$$

The total current is the sum of the differential signal current and the error current and has no error term. The total current is given by:

$$dI_{total} = dI_{signal} + dI_{error} = Vin/Re$$

The present invention compensates for gain variations due to transistor beta. Sense transistors 52 and 54 are in series with the emitters of input transistors 46 and 60. In this configuration, the Vbe of the input transistors is identical to the Vbe of the sense transistors. Thus, an accurate representation of the error voltage of the input pair is presented to the correction amplifier. The Vbe of the sense transistors, however, is further modified by the operation of two adjustment resistors 50 and 56. It can be shown that by appropriate selection of these resistances, the gain variation due to transistor beta may be greatly reduced. The principal source of gain variation originates with the so-called source loading of transistors 46 and 60 on source resistors 44 and 62, and by the alpha loss of transistors 40 and 42. The appropriate selection of adjustment resistors 50 and 56, as a first order approximation, completely eliminates both of these gain variation mechanisms.

Figures 3A, 3B:
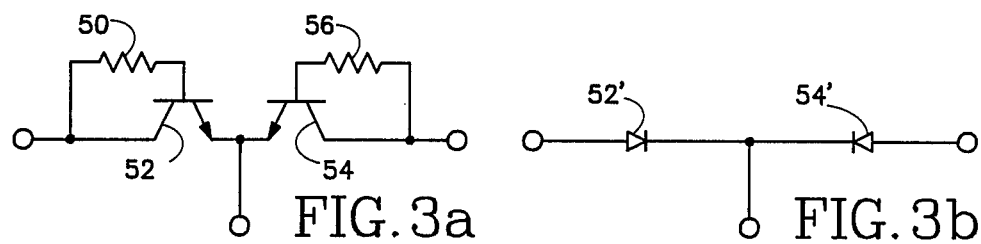
FIGS. 3a-d is a schematic diagrams of alternative error voltage sensing circuits.
Figures 3C, 3D:
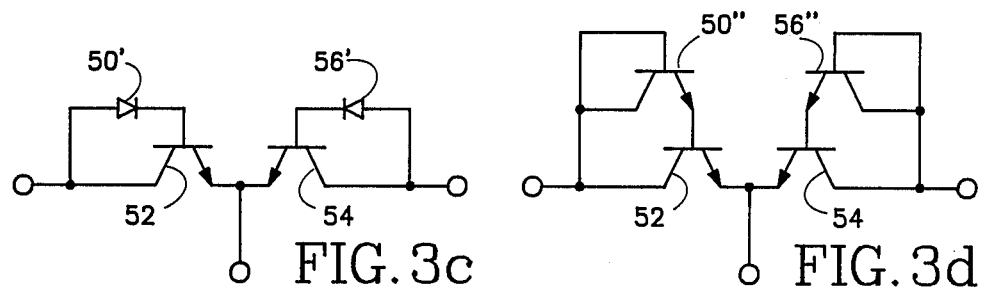

Alternative configurations for the sense transistors are compared in FIGS. 3a-d. The sensing transistors 52 and 54 in FIG. 3a include the adjustment resistors 50 and 56 which compensate for alpha loss. The diodes 52' and 54' in FIG. 3b provide a sensing function but cannot compensate for alpha loss. The sensing transistors 52 and 54 in FIG. 3c have their respective collectors and bases connected through diodes 50' and 56'. This configuration provides a measure of correction to second order Early voltage errors. The same Early voltage error correction is accomplished by the circuit configuration shown in FIG. 3d, in which diode connected transistors 50" and 56" substitute for the diodes 50' and 56' of FIG. 3c.

Figure 1:
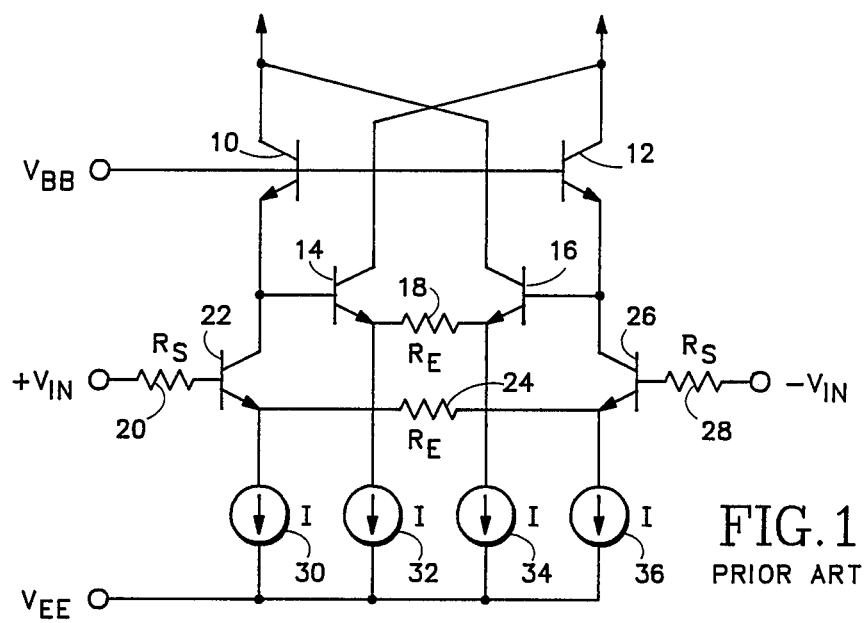
FIG. 1 is a schematic diagram of a prior art cascomp amplifier.

The present invention also provides optimum transient response without an additional common base output stage. Referring now to FIG. 1, it can be shown that the emitters of transistors 10 and 12 present an inductive impedance to the collectors of transistors 22 and 26. Further, if a load is connected to the collectors of transistors 10 and 12, a large voltage swing will be present at these terminals. Consequently a large reflected Miller capacitance will be present at the bases of transistors 14 and 16. This relatively large capacitance, in conjunction with the inductive impedance of the transistor emitters 10 and 12, creates a resonant tank circuit. This resonant circuit, in turn, creates undesirable ringing in the output current of the amplifier.

The present invention reduces ringing in the transient response. The emitters of transistors 40 and 42 are inductive, but no reflected capacitance exists at these terminals. This is because no voltage gain exists between the collectors and bases of transistors 64 and 68 due to the low AC voltage at the emitters of transistors 40 and 42. Therefore, due to the low capacitance presented by the collectors of transistors 64 and 68, no resonant circuit exists within the operational frequencies of the amplifier.

An additional benefit of the sense transistors is increased reverse breakdown voltage of the input stage. The actual breakdown voltage is increased by a factor of two because of the additional transistor in the input stage.

As in any integrated circuit, precise matching is desirable to achieve maximum performance. Therefore it is desirable that the following devices be matched: transistors 46, 52, 54, 60, 64 and 68; transistors 40 and 42; adjustment resistors 50 and 56; emitter resistors 48, 58 and 66; and current sources 70, 72 and 74. In the embodiment shown in FIG. 2, current source 72 is substantially twice the value of current sources 70 and 74. If desired, transistors 64 and 68 may be scaled from transistors 46, 52, 54 and 60, as long as current sources 70 and 74 are appropriately scaled to maintain an equal emitter current density to transistors 46, 52, 54 and 60.

Therefore, the amplifier includes several advantages over the basic cascomp design. The amplifier is capable of linear operation over a wide dynamic range, achieving optimum transient response, minimizing undesirable gain variations due to transistor beta and extending the reverse breakdown voltage of the input stage.

While I have shown and described the preferred embodiment of my invention, it will be apparent to those skilled in the art that many changes and modifications may be made without departing from the invention in its broader aspects. The appended claims therefore cover all such changes and modifications as fall therewithin.

I claim:

1. A linear transconductance amplifier for converting a differential voltage input into a differential current output, comprising:
   a. a main amplifier having first and second transistors, each transistor having a base, a collector and an emitter, the bases forming a pair of differential voltage input terminals and the collectors forming a pair of differential output terminals;
   b. first and second diode means for sensing an error voltage of said main amplifier, each diode means having a first port and a second port, the first port of said first diode means being coupled to the emitter of said first transistor, the first port of said second diode means being coupled to the emitter of said second transistor, and the second ports of each diode means being coupled together and to a source of constant current, wherein the current flowing into the first port of each diode means is substantially equal to the current flowing out of the second port of each diode means; and
   c. correction means for generating an error correction current proportional to said error voltage, said correction means being coupled between the emitters of said first and second transistors and having first and second output terminals coupled respectively to the collectors of said first and second transistors.

2. A linear transconductance amplifier in accordance with claim 1 wherein each of said diode sensing means comprises a diode having an anode and a cathode, the anode forming the first port and the cathode forming the second port.

3. A linear transconductance amplifier in accordance with claim 1 wherein each of said diode sensing means comprises a transistor having a base, a collector and an emitter, and a voltage adjustment device, said voltage adjustment device being coupled between the base and the collector of said transistor, the collector forming the first port, and the emitter forming the second port.

4. A linear transconductance amplifier as in claim 3 wherein said voltage adjustment device comprises a resistor.

5. A linear transconductance amplifier as in claim 3 wherein said voltage adjustment device comprises a diode.

6. A linear transconductance amplifier as in claim 3 wherein said voltage adjustment device comprises a diode connected transistor.

7. A linear transconductance amplifier in accordance with claim 1 further comprising a cascode output amplifier having a pair of transistors, each having a base, a collector and an emitter, coupled in common base configuration such that said emitters are respectively coupled to said collectors of said first and second transistors, and said collectors of said transistors providing the differential current output.

8. A linear transconductance amplifier for converting a differential voltage input into a differential current output, comprising:
   a. a main amplifier having first and second transistors, each transistor having a base, a collector and an emitter, each emitter being coupled through a respective first and second series emitter resistor to a respective first and second emitter resistance terminal, the bases forming a pair of differential voltage input terminals, the collectors forming a pair of differential output terminals;
   b. first and second diode means for sensing an error voltage of said main amplifier, each diode means having a first port and a second port, the first port of said first diode means being coupled to the first emitter resistance terminal, the first port of said second diode means being coupled to the second emitter resistance terminal, and the second ports of each diode means being coupled together and to a source of constant current, wherein the current flowing into the first port of each diode means is substantially equal to the current flowing out of the second port of each diode means; and
   c. correction means for generating an error correction current proportional to said error voltage, said correction means being coupled between the emitter resistance terminals and having first and second output terminals coupled respectively to the collectors of said first and second transistors.

9. A linear transconductance amplifier in accordance with claim 8 wherein each of said diode sensing means comprises a diode having an anode and a cathode, the anode forming the first port and the cathode forming the second port.

10. A linear transconductance amplifier in accordance with claim 8 wherein each of said diode sensing means comprises a transistor having a base, a collector and an emitter, and a voltage adjustment device, said voltage adjustment device being coupled between the base and the collector of said transistor, the collector forming the first port, and the emitter forming the second port.

11. A linear transconductance amplifier as in claim 10 wherein said voltage adjustment device comprises a resistor.

12. A linear transconductance amplifier as in claim 10 wherein said voltage adjustment device comprises a diode.

13. A linear transconductance amplifier as in claim 10 wherein said voltage adjustment device comprises a diode connected transistor.

14. A linear transconductance amplifier in accordance with claim 8 wherein said correction means comprises third and fourth transistors, each having a base, a collector and an emitter, a pair of current sources and a resistor, said resistor being coupled between said emitters of said third and fourth transistors, said pair of current sources being respectively coupled to said emitters of said third and fourth transistors, said bases of said third and fourth transistors being respectively coupled to said emitter resistance terminals and said collectors of said third and fourth transistors respectively coupled to said collectors of said first and second transistors.

15. A linear transconductance amplifier in accordance with claim 8 further comprising a cascode output amplifier having a pair of transistors, each having a base, a collector and an emitter, coupled in common base configuration such that said emitters are respectively coupled to said collectors of said first and second transistors, and said collectors of said transistors providing the differential current output.

* * * * *